United States Patent
Pan et al.

(10) Patent No.: US 10,522,365 B2
(45) Date of Patent: Dec. 31, 2019

(54) METHODS FOR REDUCING SCRATCH DEFECTS IN CHEMICAL MECHANICAL PLANARIZATION

(71) Applicant: Taiwan Semiconductor Manufacturing Co., Ltd., Hsin-Chu (TW)

(72) Inventors: Wan-Chun Pan, Hsinchu (TW); William Weilun Hong, Hsinchu (TW); Ying-Tsung Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 333 days.

(21) Appl. No.: 15/182,291

(22) Filed: Jun. 14, 2016

(65) Prior Publication Data
US 2017/0213743 A1   Jul. 27, 2017

Related U.S. Application Data

(60) Provisional application No. 62/287,642, filed on Jan. 27, 2016.

(51) Int. Cl.
*H01L 21/3105* (2006.01)
*H01L 21/02* (2006.01)
(Continued)

(52) U.S. Cl.
CPC .. *H01L 21/31051* (2013.01); *H01L 21/02164* (2013.01); *H01L 21/02205* (2013.01);
(Continued)

(58) Field of Classification Search
CPC ......... H01L 21/31051; H01L 21/02323; H01L 21/02164; H01L 21/02205;
(Continued)

(56) References Cited

U.S. PATENT DOCUMENTS

| 5,643,406 A | 7/1997 | Shimomura et al. |
| 5,869,384 A * | 2/1999 | Yu .................. H01L 21/76224 257/E21.546 |

(Continued)

FOREIGN PATENT DOCUMENTS

| CN | 101459124 | 6/2009 |
| CN | 101577245 | 11/2009 |

(Continued)

OTHER PUBLICATIONS

Masahura Nakamori and Nahomi Aoto, Reaction on Si(100) and Chemical oxide Surfaces in Dissolved-Oxygen Controlled Deionized Water, Feb. 1998, Jpn J. Appl. Phys., vol. 37, pp. 462-465.*

(Continued)

*Primary Examiner* — Mohsen Ahmadi
*Assistant Examiner* — Scott E Bauman
(74) *Attorney, Agent, or Firm* — Haynes and Boone, LLP

(57) ABSTRACT

Disclosed is a method of forming a semiconductor device. The method includes providing a precursor having a substrate and protrusions over the substrate. The protrusions are interposed by trenches. The method further includes depositing a first dielectric layer over the protrusions and filling the trenches. The first dielectric layer has a first hardness. The method further includes treating the first dielectric layer with an oxidizer. The method further includes performing a chemical mechanical planarization (CMP) process to the first dielectric layer.

20 Claims, 10 Drawing Sheets

(51) Int. Cl.
   *H01L 21/8234* (2006.01)
   *H01L 21/762* (2006.01)
   *H01L 21/84* (2006.01)

(52) U.S. Cl.
   CPC .. *H01L 21/02323* (2013.01); *H01L 21/02337* (2013.01); *H01L 21/02343* (2013.01); *H01L 21/3105* (2013.01); *H01L 21/31053* (2013.01)

(58) Field of Classification Search
   CPC .......... H01L 21/31053; H01L 21/3105; H01L 21/02337; H01L 21/02343; H01L 21/76224; H01L 21/823481; H01L 21/823431; H01L 21/845
   USPC ........................................................ 438/424
   See application file for complete search history.

(56) References Cited

U.S. PATENT DOCUMENTS

| | | | |
|---|---|---|---|
| 6,082,373 A | 7/2000 | Sakurai et al. | |
| 6,265,781 B1 | 7/2001 | Andreas | |
| 6,526,995 B1 | 3/2003 | Hackenberg | |
| 6,776,691 B2 * | 8/2004 | Nishimura | B08B 3/00 |
| | | | 29/852 |
| 7,318,870 B2 | 1/2008 | Han et al. | |
| 2001/0023127 A1 | 9/2001 | Andreas | |
| 2002/0111026 A1 | 8/2002 | Small et al. | |
| 2006/0003596 A1 * | 1/2006 | Fucsko | H01L 21/02236 |
| | | | 438/758 |
| 2007/0152252 A1 | 7/2007 | Buehler et al. | |
| 2011/0269303 A1 | 11/2011 | Marxsen et al. | |
| 2013/0105919 A1 | 5/2013 | Jiang et al. | |
| 2014/0231919 A1 * | 8/2014 | Peng | H01L 21/76224 |
| | | | 257/368 |
| 2014/0239347 A1 * | 8/2014 | van Dal | H01L 29/0688 |
| | | | 257/192 |
| 2014/0252432 A1 * | 9/2014 | Huang | H01L 21/76224 |
| | | | 257/288 |
| 2014/0256133 A1 | 9/2014 | Devarapalli et al. | |
| 2014/0291766 A1 * | 10/2014 | Hafez | H01L 27/0886 |
| | | | 257/365 |
| 2015/0034899 A1 * | 2/2015 | Ching | H01L 29/66439 |
| | | | 257/9 |
| 2015/0179503 A1 * | 6/2015 | Tsai | H01L 21/76224 |
| | | | 257/347 |
| 2015/0287611 A1 * | 10/2015 | Zhao | H01L 21/02164 |
| | | | 257/368 |
| 2016/0372551 A1 * | 12/2016 | Doris | H01L 29/1054 |

FOREIGN PATENT DOCUMENTS

| | | |
|---|---|---|
| KR | 20040051698 | 6/2004 |
| KR | 10080821830 | 4/2008 |
| TW | 201507158 | 2/2015 |

OTHER PUBLICATIONS

Office Action dated Oct. 30, 2015, issued by the Korean Patent Office in Korean Patent Application No. 10-2014-0184689, 15 pages.

Xia, Sr,, Annie, "Production of High Purity Functional Water at Point-of-Use for Advanced Mask Cleaning Processes," Proceedings of the 2010 International Workshop on EUV Lithography, Jun. 22-24, 2010, pp. 1-13.

* cited by examiner

METHODS FOR REDUCING SCRATCH DEFECTS IN CHEMICAL MECHANICAL PLANARIZATION

PRIORITY DATA

This application claims the benefit of U.S. Prov. App. No. 62/287,642 entitled "Methods for Reducing Scratch Defects in Chemical Mechanical Planarization," filed Jan. 27, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. This scaling down process generally provides benefits by increasing production efficiency and lowering associated costs. Such scaling down has also increased the complexity of processing and manufacturing ICs. For these technological advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One type of the multi-gate devices is FinFETs—transistors with a fin-like semiconductor channel ("fin") and a gate electrode engaging the fin on two or three sides thereof. In a typical FinFET formation process, fins are formed out of a substrate (e.g., through epitaxial and/or etching processes) and are separated by deep trenches. The trenches are subsequently filled with a gap-fill dielectric material as an isolation structure. As the device miniaturization continues, the aspect ratio (height vs. width) of the trenches also increases. As a result, the density of the gap-fill material is decreased in order to fill the deep trenches properly. However, the low density gap-fill material frequently suffers from scratch defects during subsequent chemical mechanical planarization (CMP) processes. Furthermore, a single layer of the gap-fill material is sometimes inadequate to meet low wet etch rate requirements. In these cases, two or more layers of gap-fill materials are deposited as a film stack. Adjacent films in the film stack sometimes suffer from poor adhesion between them.

Accordingly, improvements in these areas are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
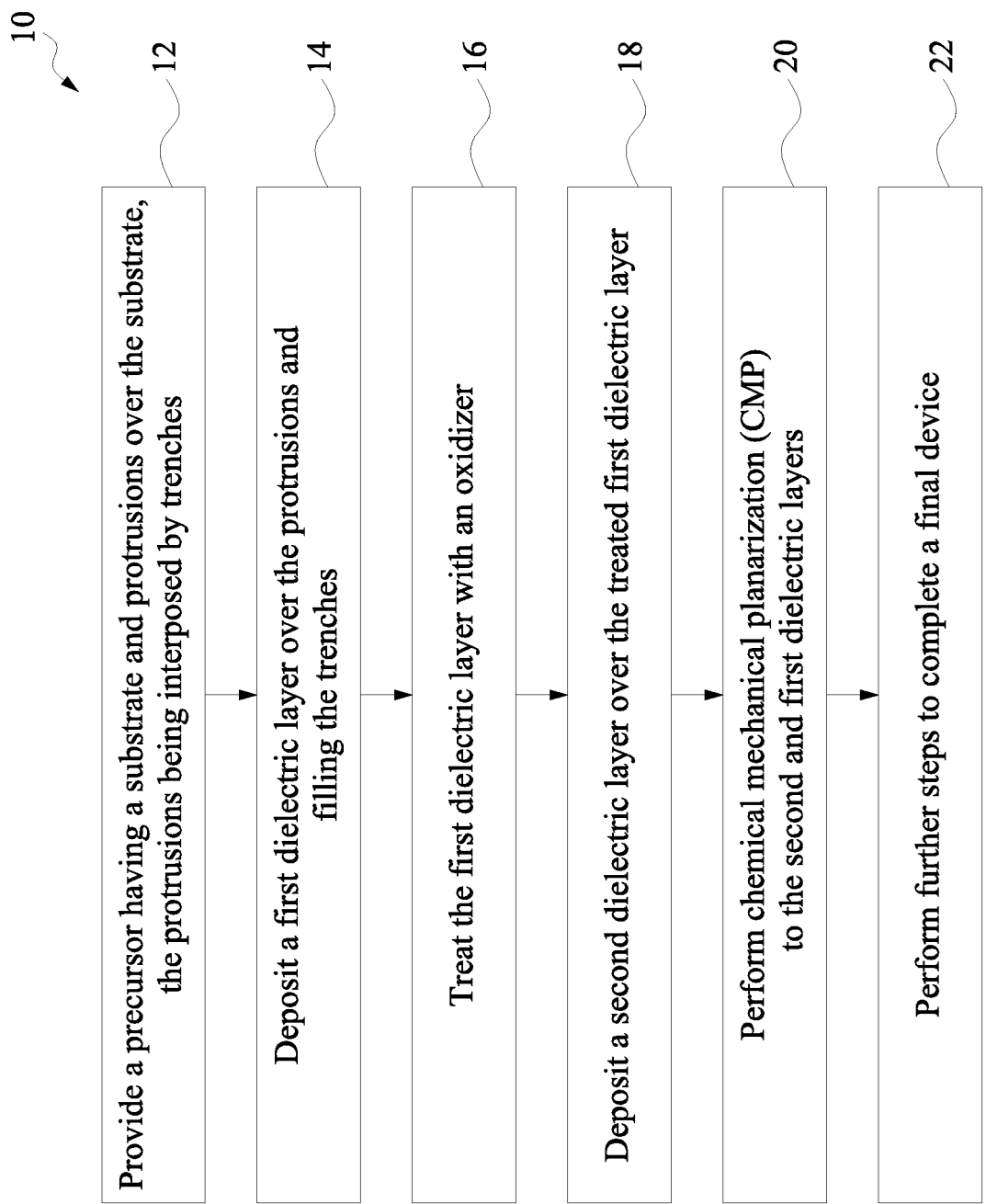
FIG. 1 is a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of forming FinFETs as well as replacement gate processes for FinFETs. In a typical FinFET process, multiple parallel fins are formed as protrusions over a substrate and are separated by deep trenches. Then, a dielectric gap-fill material is deposited into the trenches and over the fins as isolation. As the process nodes are scaled down, an aspect ratio of the deep trenches (a ratio between a height and a width of the deep trenches) has increased. In some cases, the aspect ratio may be 12 or greater. Consequently, it may be difficult to properly fill the deep trenches with a dense gap-fill material. To counter this issue, a material having lower density is typically used as the gap-fill material in advanced process nodes. However, such lower density material frequently suffers from defects (e.g., scratch defects) during subsequent CMP process. Such CMP defects may cause leakage, shorts, opens, or other problems in the final IC products. Another issue in FinFET formation is poor adhesion between two or more layers of gap-fill materials. Although a lower density gap-fill material can fill deep trenches, its wet etch resistance may not be sufficient in some cases. Accordingly, a higher density gap-fill material is deposited over the lower density gap-fill material as a complement. The interface between the higher density and the lower density gap-fill materials may suffer from poor adhesion.

The present disclosure provides methods for strengthening such lower density gap-fill material before it undergoes the CMP process, thereby reducing CMP defects in the final IC products. Some embodiments of the present disclosure strengthen the lower density gap-fill material by treating a top portion of the material in a thermally controlled aqueous oxidizer. Such methods can be readily integrated into existing manufacturing flow. Furthermore, the treated portion of the material has good adhesion with a higher density gap-fill material deposited thereon.

Embodiments of the present disclosure may be applied in replacement gate processes in addition to fin formation processes. One of ordinary skill may recognize other examples of semiconductor devices and manufacturing flows that may benefit from aspects of the present disclosure.

Figure 2B:
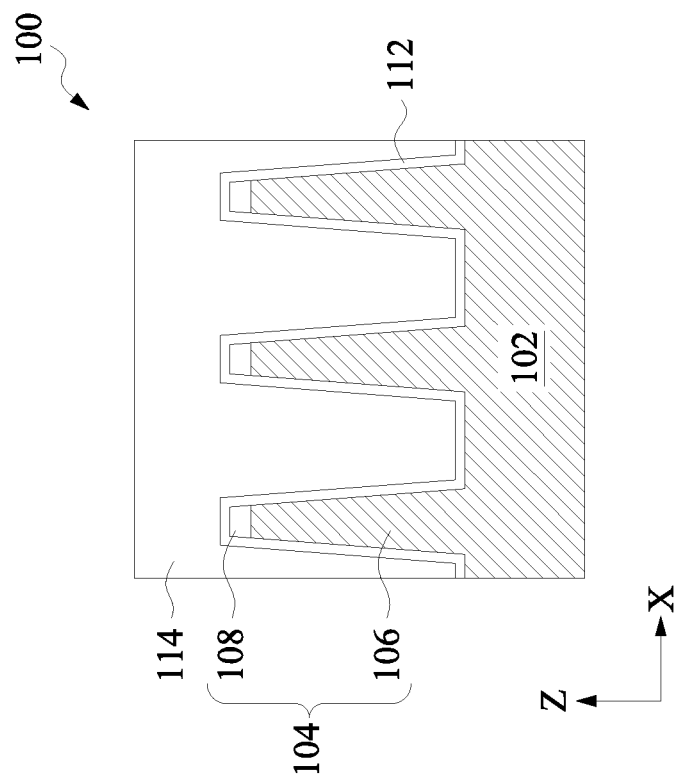
FIGS. 2A, 2B, 2C, 2D, 2E, 2F, and 2G are cross-sectional views of a portion of a semiconductor device in various fabrication stages according to the method in FIG. 1, in accordance to an embodiment.
Figure 2A:
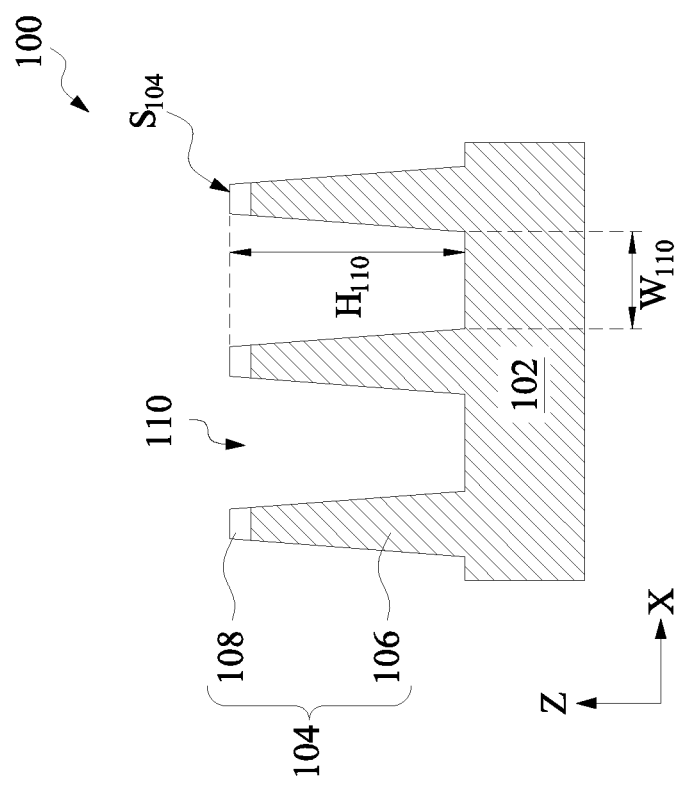

FIG. 1 shows a flow chart of a method 10 of forming a semiconductor device 100 having FinFETs, according to various aspects of the present disclosure. FIG. 3 shows a flow chart of a method 50 of forming a semiconductor device 200 using a replacement gate process, according to various aspects of the present disclosure. The method 50 may be considered an embodiment of the method 10. The methods 10 and 50 are merely examples, and are not intended to limit the present disclosure beyond what is explicitly recited in the claims. Additional operations can be provided before, during, and after the methods 10 and 50, and some operations described can be replaced, eliminated, or relocated for additional embodiments of the methods. The method 10 is described below in conjunction with FIGS. 2A-2G, while the method 50 is described below in conjunction with FIGS. 4A-4G.

As will be seen, each of the semiconductor devices 100 and 200 may be included in an IC such as a microprocessor, memory device, and/or other IC which may comprise passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, multi-gate FETs including FinFETs, and combinations thereof.

Referring to FIG. 1, at operation 12, the method 10 provides (or is provided with) a precursor of the device 100. For the convenience of discussion, the precursor is also referred to as the device 100. Referring to FIG. 2A, the device 100 includes a substrate 102 and multiple protrusions 104 over the substrate 102. The protrusions 104 are separated (or interposed) by trenches 110. In embodiments, the substrate 102 may be a semiconductor substrate such as a silicon wafer. The substrate 102 may also include other semiconductors such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. Further, the substrate 102 may optionally include epitaxial layers, be strained for performance enhancement, include a silicon-on-insulator structure, and/or have other suitable enhancement features.

In the present embodiment, the protrusions 104 include semiconductor fins 106 and a dielectric hard mask (HM) layer 108. The semiconductor fins 106 may be formed out of portions of the substrate 102. The dielectric HM layer 108 may include silicon nitride or other suitable material(s). In an embodiment, the protrusions 104 are formed by one or more photolithography processes and etching processes. In an exemplary process, the dielectric HM layer 108 is deposited as a blanket layer over the substrate 102 by chemical vapor deposition (CVD), plasma enhanced CVD (PECVD), physical vapor deposition (PVD), thermal oxidation, or other techniques. Then, a masking element is formed over the dielectric HM layer 108 using a photolithography process. The photolithography process may include forming a photoresist (or resist) over the blanket HM layer 108, exposing the resist to a pattern that defines geometrical shapes for the fins 106 (or the trenches 110), performing post-exposure bake processes, and developing the resist to form the masking element. The masking element provides openings corresponding to the trenches 110.

Subsequently, the blanket HM layer 108 and the substrate 102 are etched through the openings to form the protrusions 104 as shown in FIG. 2A, using a dry etching process, a wet etching process, or other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

As shown in FIG. 2A, the protrusions 104 provide a top surface $S_{104}$. The trenches 110 each have a width $W_{110}$ in the "X" direction and a height $H_{110}$ in the "Z" direction. An aspect ratio of the trenches 110 is defined to be a ratio of $H_{110}$ over $W_{110}$. The aspect ratio increases as the device miniaturization continues. In an embodiment, the aspect ratio is 12 or greater.

At operation 14, the method 10 (FIG. 1) deposits a dielectric layer 114 over the protrusions 104 and filling the trenches 110. Referring to FIG. 2B, the dielectric layer 114 buries the protrusions 104 underneath and electrically isolates the protrusions 104 from one another. In the present embodiment, before the dielectric layer 114 is deposited, a liner layer 112 is formed over surfaces of the protrusions 104. The liner layer 112 includes silicon oxide in one example and may be formed by thermal oxidation, CVD, PVD, or other deposition techniques. The liner layer 112 may comprise other dielectric material(s), and may be omitted in some embodiments.

In the present embodiment, in order to properly fill the topography over the substrate 102 and particularly due to the high aspect ratio of the trenches 110, a low density dielectric material containing silicon and oxygen is used as the dielectric layer 114. Furthermore, the operation 14 uses a flowable CVD (FCVD) method to deposit the dielectric layer 114. For example, the operation 14 may introduce a silicon-containing compound and an oxygen-containing compound as deposition precursors. The silicon-containing compound and the oxygen-containing compound react to form a flowable dielectric material (such as a liquid compound), thereby filling the trenches 110. In alternative embodiments, the dielectric layer 114 may be deposited using other CVD methods or other deposition techniques such as spin coating. In embodiments, materials suitable for the dielectric layer 114 include tetraethylorthosilicate oxide, un-doped silicate glass (USG), or doped silicon oxide such as fused silica glass (FSG), phosphosilicate glass (PSG), boron doped silicon glass, borophosphosilicate glass (BPSG), other silicon- and oxygen-containing low density dielectric materials, and other suitable dielectric materials. A subsequent annealing process is performed to convert the flowable dielectric material to a solid material. For example, the annealing process may be performed at a temperature of about 300 degrees Celsius (° C.) to 1200° C. for a period of about two to ten hours. However, annealing the device 100 at a high temperature for a prolonged period is not desirable in some instances. For example, such annealing process may eliminate tensile strains in n-channel devices and degrade device performance. This problem is generally referred to as strain relaxation. Furthermore, even with the annealing process, the dielectric layer 114 still may not have enough wet etch resistance for subsequent fabrication steps.

In one particular example, a subsequent fabrication step includes a chemical mechanical planarization (CMP) process to the dielectric layer 114. The CMP process is intended to planarize a top surface of the device 100 and to expose the protrusions 104. Due to the relatively low material density in the dielectric layer 114, the CMP process might cause various defects in the dielectric layer 114 in some instances. The CMP defects may include organic residues, water marks, particle adherence and impingement, corrosion pit, and scratches. CMP scratch defects are particularly serious because they may cause short circuits, open circuits, and/or pattern removal in large areas, thereby affecting yield and long term reliability of the IC devices. The inventors of the present disclosure have discovered an efficient and effective way of strengthening the dielectric layer 114, thereby reducing CMP scratch defects in subsequent fabrication.

At operation 16, the method 10 (FIG. 1) treats the dielectric layer 114 with an oxidizer 116. Referring to FIG. 2C, in an embodiment, the oxidizer 116 is applied evenly across an entire surface of the device 100. In the present embodiment, the oxidizer 116 is an aqueous oxidizer, which makes the operation 16 readily integrable with other fabrication steps of the method 10, such as the operation 14 and operation 18 to be discussed later. For example, the operations 14, 16, and 18 may all be performed in a wet bench manufacturing environment. In an embodiment, the aqueous oxidizer 116 is deionized water (DIW). In another embodiment, the aqueous oxidizer 116 is dilute hydrofluoric acid (DHF). Since DHF may have both etching and oxidizing effects upon the dielectric layer 114 (e.g., silicon oxide), the concentration of hydrofluoric acid (HF) in the DHF oxidizer 116 is tuned such that the DHF oxidizer 116 properly oxidizes the dielectric layer 114 without causing too much film loss at the same time. In an embodiment, the concentration of HF in the DHF oxidizer 116 is tuned to be in a range from 0.005% to 0.1%. The aqueous oxidizer 116 may be applied onto the dielectric layer 114 using spray, spin-on, or other suitable techniques. In an embodiment, the operation 16 may apply more than one oxidizer in a sequential manner. For example, the operation 16 may apply DIW (or DHF) as a first oxidizer. After some treatment time, the operation 16 applies DHF (or DIW) as a second oxidizer that is different from the first oxidizer. Compared with the annealing step in the operation 14, the operation 16 is more efficient in oxidation. Even though the annealing step may use wet annealing with water steam (or water vapor), the water contents are rather diluted due to the use of carrier gas, such as nitrogen gas, in the annealing step.

In the present embodiment, the operation 16 is performed in a thermally-controlled manner. Particularly, the operation 16 is performed at a temperature below 100° C., which is consistent with certain wet bench manufacturing flows when the oxidizer 116 is aqueous. For example, the operation 16 may be performed at a temperature ranging from 15° C. to 90° C., such as at room temperature of about 25° C. Notably, such temperature is much lower than typical temperatures used for annealing the dielectric layer 114 in the operation 14. Accordingly, the operation 16 does not lead to the strain relaxation issue discussed above. In various embodiments, the operation 16 may be performed for few seconds to few minutes, such as from 3 seconds to about 120 seconds, depending on the oxidizer used and the treatment temperature.

In alternative embodiments, the oxidizer 116 may be other aqueous solutions in addition to DIW and DHF. For example, the oxidizer 116 may be dilute hydrogen peroxide ($H_2O_2$). In further embodiments, the oxidizer 116 may be a gaseous oxidizer, such as oxygen gas.

Figure 2D:
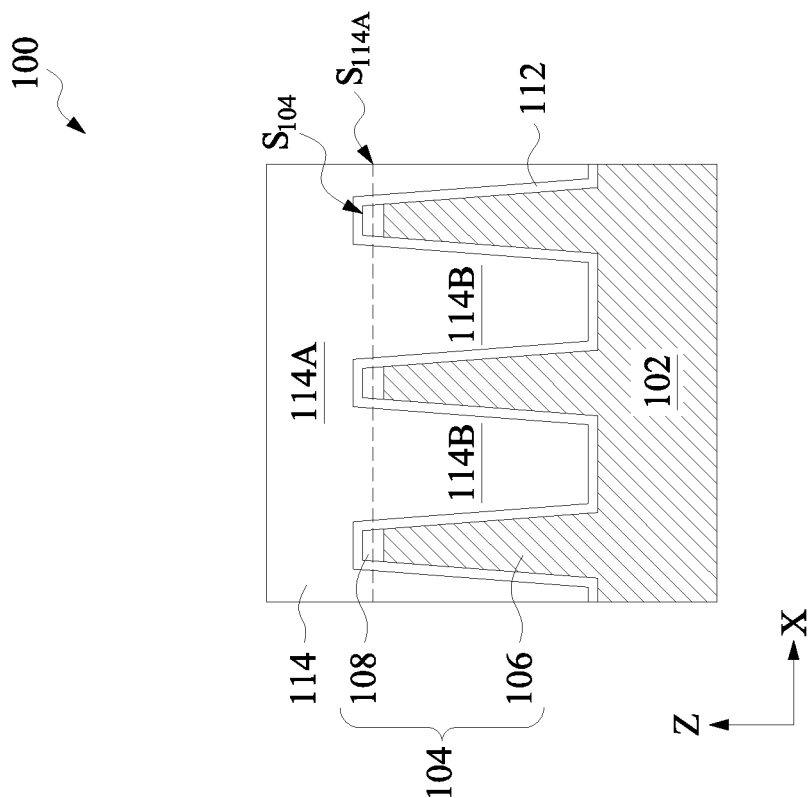
Figure 2C:
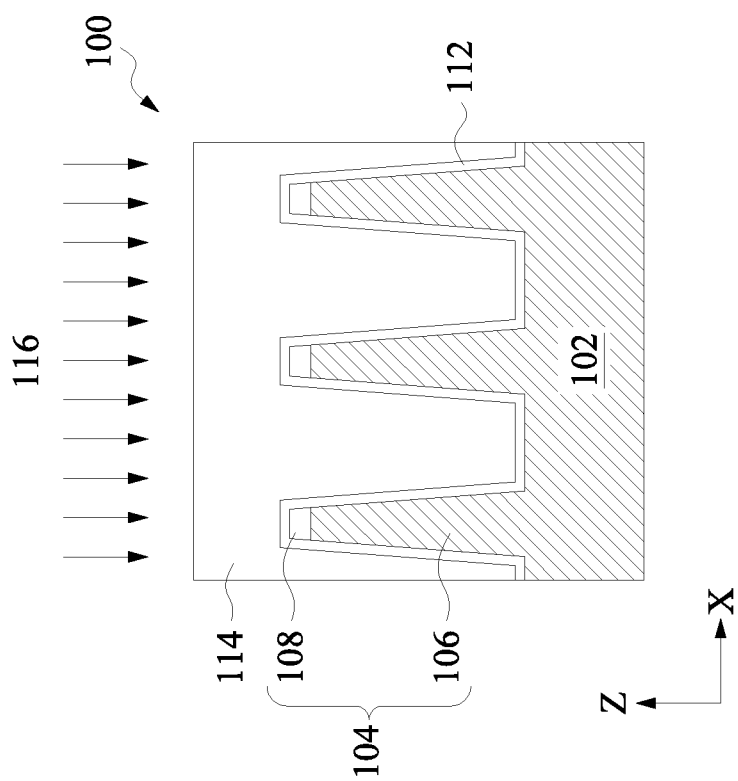
Figure 3:
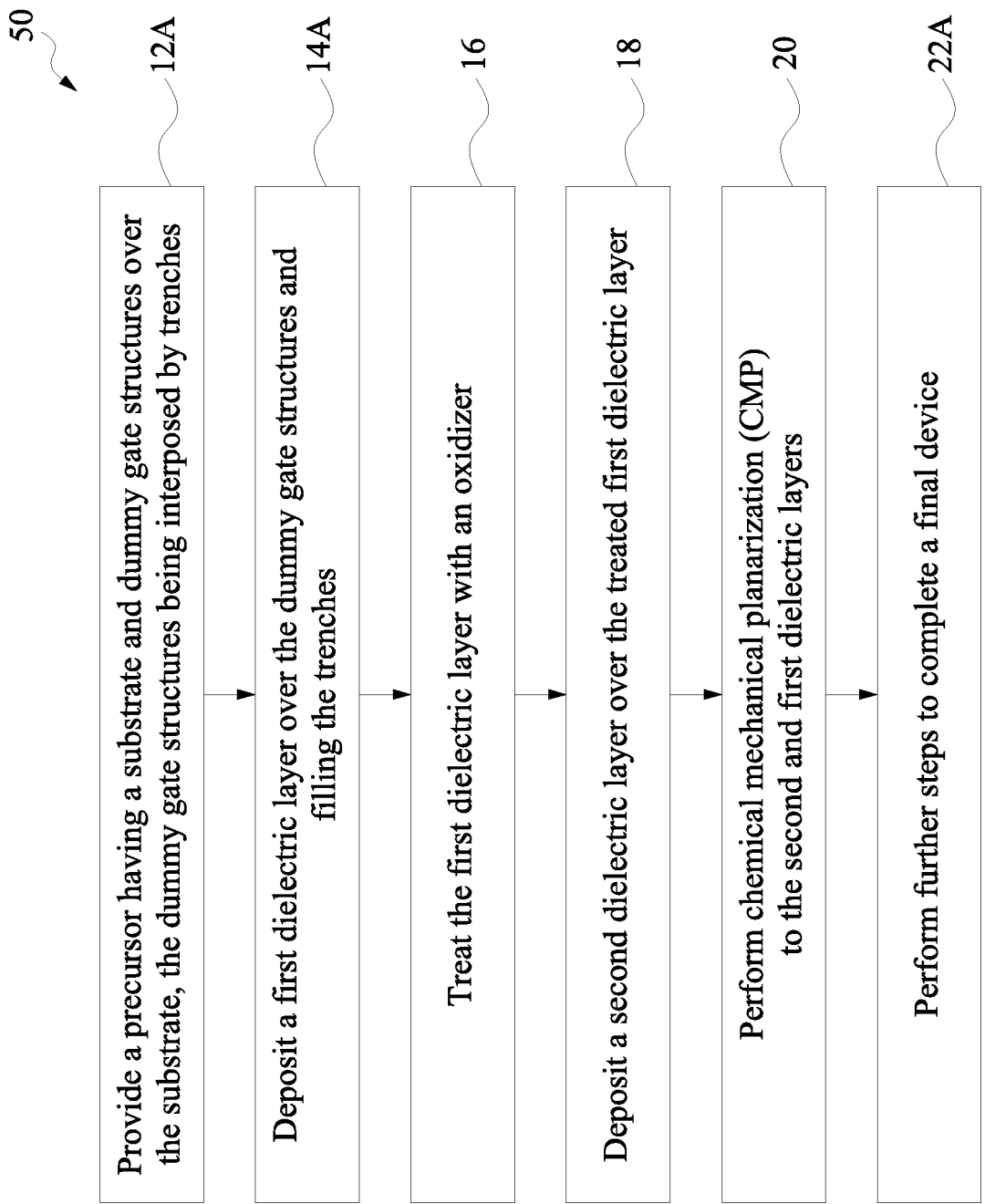
FIG. 3 is a flow chart of an embodiment of the method in FIG. 1, according to various aspects of the present disclosure.

FIG. 2D illustrates the device 100 after the operation 16 is completed. Referring to FIG. 2D, an upper portion 114A of the dielectric layer 114 is treated with the oxidizer 116, and a lower portion 114B of the dielectric layer 114 is not treated or is insignificantly treated. The upper portion 114A (also referred to as the treated portion 114A) has a higher hardness than the lower portion 114B (also referred to as the untreated portion 114B). In some embodiments, the hardness of the treated portion 114A is about 1.1~1.2 times higher than the hardness of the untreated portion 114B. Additionally, the treated portion 114A may have a higher film density than the untreated portion 114B. An imaginary boundary between the portions 114A and 114B is denoted as $S_{114A}$. In reality, the hardness (as well as film density) of the dielectric layer 114 may change gradually from its top surface towards the substrate 102. Therefore, there is no abrupt change of material at the boundary $S_{114A}$. In an example where the dielectric layer 114 contains silicon and oxygen, the treated portion 114A now has higher contents of silicon-oxygen bonds than the untreated portion 114B. In the present embodiment, the temperature, oxidizer concentration, and treatment time of the operation 16 are tuned such that the boundary $S_{114A}$ is below the top surface $S_{104}$ of the protrusions 104. The treated portion 114A provides sufficient film hardness for reducing CMP scratch defects thereupon.

Figure 2F:
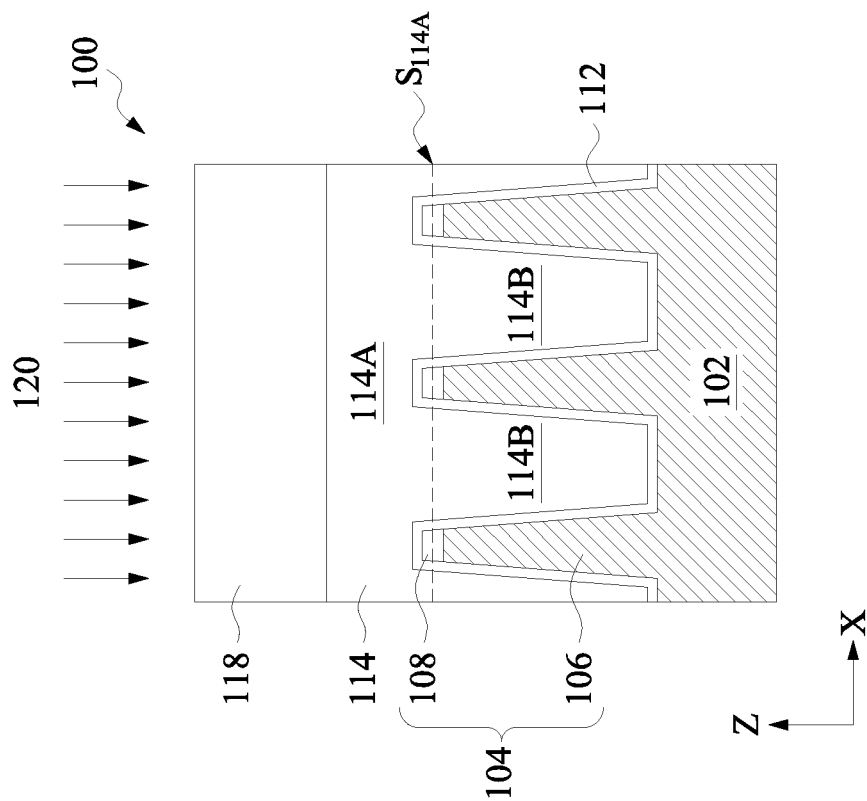
Figure 2E:
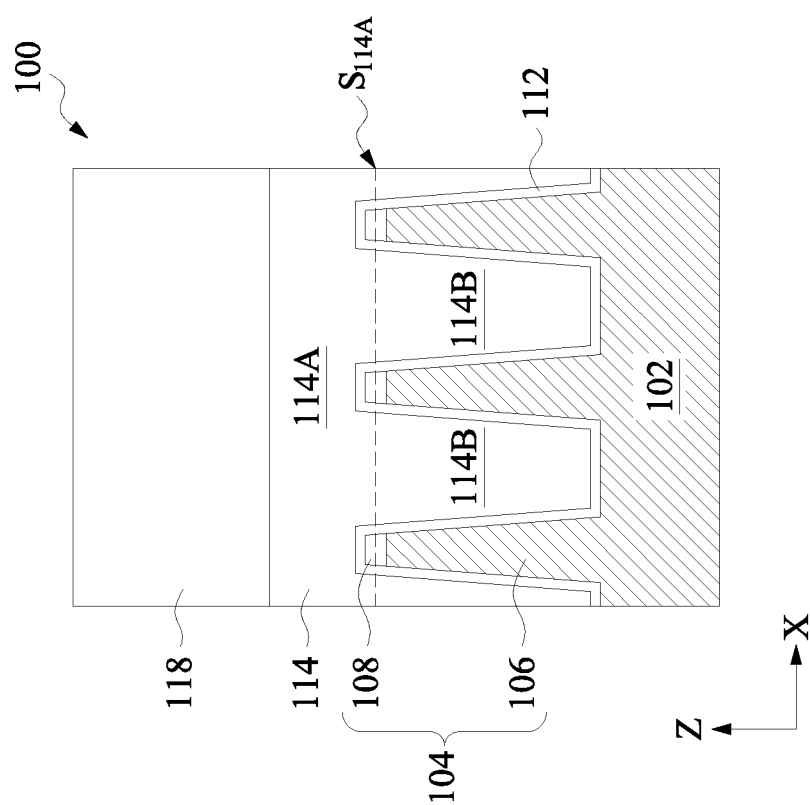

At operation 18, the method 10 (FIG. 1) deposits another dielectric layer 118 over the treated portion 114A (FIG. 2E). The dielectric layer 118 has a higher hardness than the dielectric layer 114 before it is treated in the operation 16. For example, the hardness of the dielectric layer 118 may be 1.1 to 1.5 times higher than that of the dielectric layer 114 before it is treated. This is to satisfy the needs of both film thickness and low etch resistance for a subsequent CMP process. In an embodiment, the hardness of the dielectric layer 118 is even higher than the treated portion 114A. Notably, adhesion between the treated portion 114A and the dielectric layer 118 is better than what would be between the original dielectric layer 114 and the dielectric layer 118.

In embodiments, materials suitable for the dielectric layer 118 include tetraethylorthosilicate oxide, un-doped silicate glass (USG), or doped silicon oxide such as fused silica glass (FSG), phosphosilicate glass (PSG), boron doped silicon glass, borophosphosilicate glass (BPSG), other silicon and oxygen containing dielectric materials, and other suitable dielectric materials. In an embodiment, the dielectric layer 118 is deposited using an FCVD method. Alternatively, the dielectric layer 118 may be deposited using other CVD methods, PVD, spin coating, or other deposition techniques.

Figure 2G:
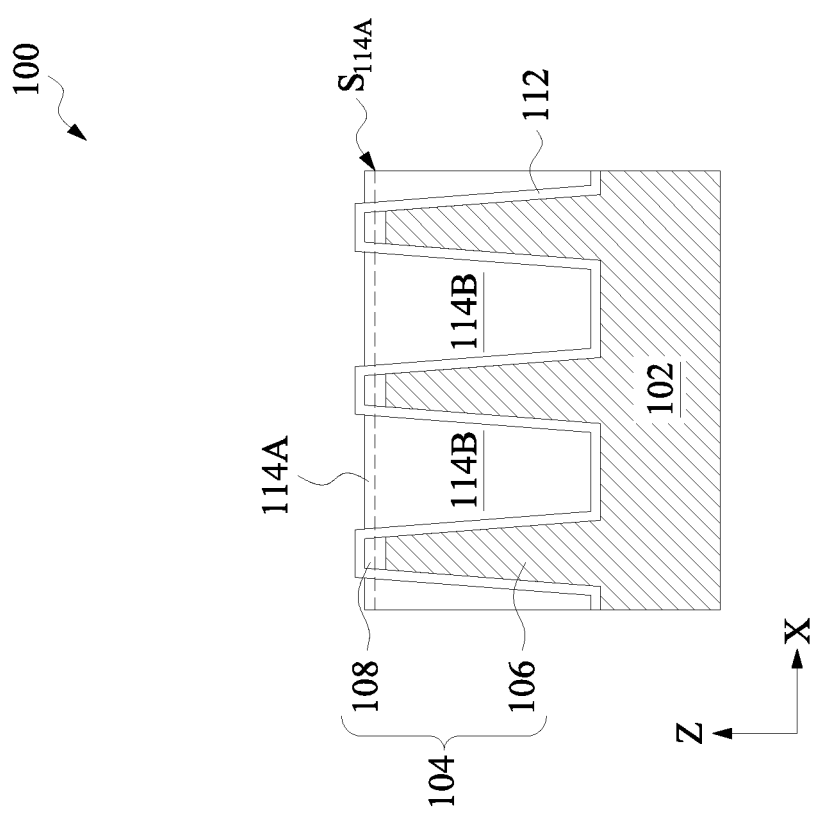

At operation 20, the method 10 (FIG. 1) performs a CMP process 120 to recess the dielectric layers 118 and 114 (FIG. 2F). The CMP process 120 uses appropriate CMP consumables such as CMP polishing pad, CMP slurry, and CMP conditioner tuned for recessing the materials of the dielectric layers 118 and 114. For example, the CMP polishing pad may be a hard pad or a soft pad, and may further have pores or grooves. The CMP slurry may include ferric nitrate, peroxide, potassium iodate, ammonia, silica, alumina, and/or other slurry materials. The CMP slurry may further contain abrasives, pH adjustors, and one or more additives such as oxidizing agents, complexing agents, corrosion inhibitors, and dispersion agents. In an embodiment, the dielectric layers 118 and 114 contain silicon oxide, and the CMP process 120 uses cerium oxide ($CeO_2$) based slurry. The CMP process 120 completely removes the dielectric layer 118 and partially removes the dielectric layer 114, thereby exposing topography underneath for subsequent fabrication (FIG. 2G). In an embodiment, the CMP process 120 includes first and second stages. In the first stage, a higher down-force is applied for completely removing the dielectric layer 118 and partially removing the dielectric layer 114. In the second stage, a lower down-force is applied for precise thickness control in the remaining portion of the dielectric layer 114. Due to the oxidation treatment, CMP scratch defects at the dielectric layer 114 are significantly reduced. At some instances, a reduction of CMP scratch defects by 50% to 75% has been observed.

At operation 22, the method 10 (FIG. 1) performs further steps to complete a final FinFET device. In one example, the operation 22 replaces the semiconductor fins 106 with one or more epitaxially grown semiconductor layers. To further this example, the operation 22 removes the dielectric HM layer 108 and partially removes the semiconductor fins 106 by one or more etching processes, thereby forming openings. Subsequently, the operation 22 epitaxially grows semiconductor layers in the openings. In another example, the operation 22 recesses the dielectric layer 114 to partially expose the semiconductor fins 106. Subsequently, the operation 22 forms gate electrodes over the semiconductor fins 106, forms source and drain features, forms contacts, and so on, in order to form a FinFET.

FIG. 3 shows a flow chart of the method 50 of forming the semiconductor device 200 using a replacement gate process, according to various aspects of the present disclosure. The method 50 may be considered an embodiment of the method 10. The method 50 is briefly discussed below, in conjunction with FIGS. 4A-4G. FIG. 4A is a perspective view of a portion of the semiconductor device 200, while FIGS. 4B-4G are cross-sectional view of the portion of the semiconductor device 200 along the "1-1" line in FIG. 4A.

At operation 12A, the method 50 (FIG. 3) provides (or is provided with) a precursor having a substrate 202 and protrusions 208 over the substrate 202. Referring to FIG. 4A, the protrusions 208 are dummy gate structures for a replacement gate process. Hence, they are also referred to as the dummy gates 208 in the following discussion. The dummy gates 208 are separated by trenches 230. The device 200 further includes fins 204 over the substrate 202 and an isolation structure 206 over the substrate 202 and between adjacent fins 204. In an embodiment, the substrate 202, the fins 204, and the isolation structure 206 may be similar to the substrate 102, the fins 106, and the dielectric layer 114 in FIG. 2G, respectively. For the purposes of simplicity, detailed descriptions of these features are omitted.

Figure 4B:
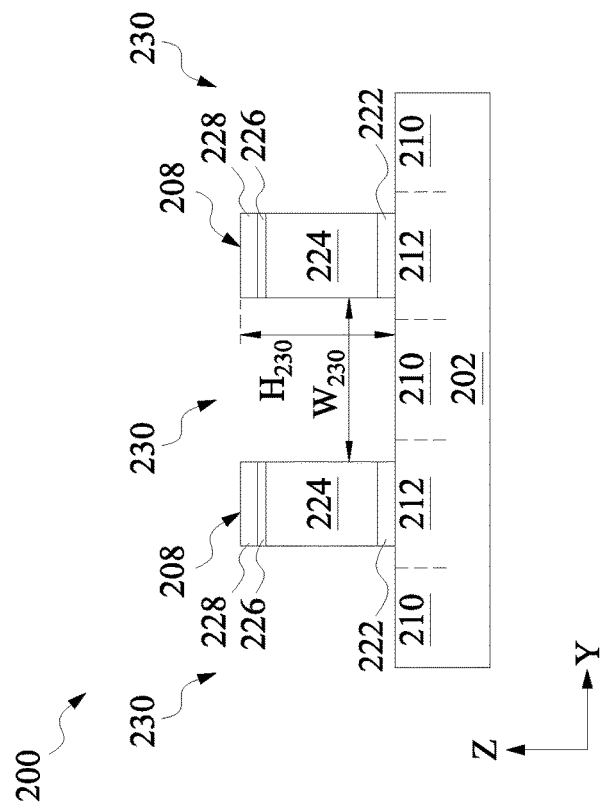
FIGS. 4B, 4C, 4D, 4E, 4F, and 4G are cross-sectional views of a portion of the semiconductor device in FIG. 4A during various fabrication stages according to embodiments of the method in FIG. 3.
Figure 4A:
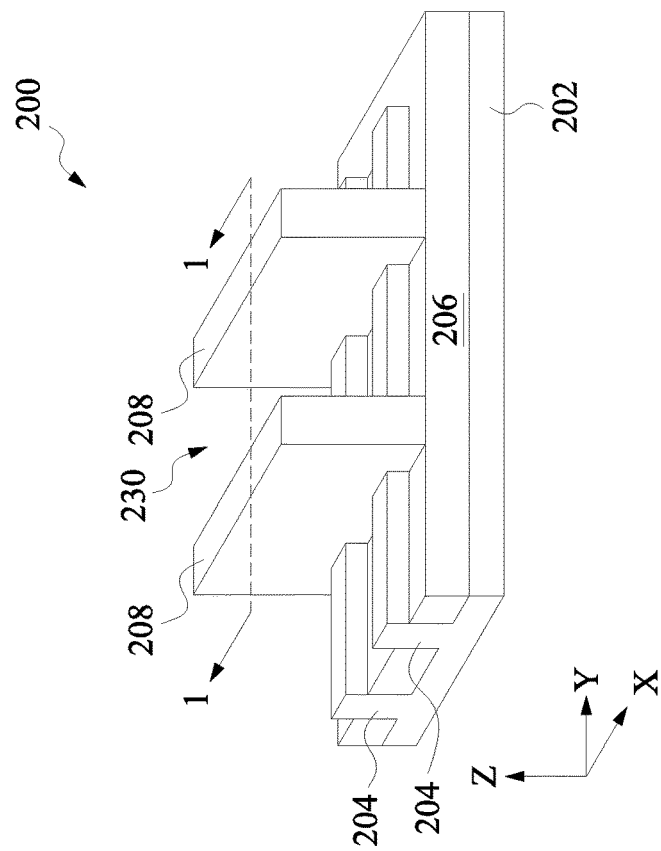
FIG. 4A is a perspective view of a portion of a semiconductor device fabricated with the method in FIG. 3, in accordance to an embodiment.

Referring to FIG. 4B, the dummy gates 208 each include an oxide layer 222, a gate electrode layer 224, a hard mask layer 226, and a capping layer 228. The oxide layer 222 may comprise a dielectric material such as silicon oxide. The gate electrode layer 224 may comprise a single layer or multi-layer structure. In an embodiment, the gate electrode layer 224 comprises polysilicon. In an embodiment, the hard mask layer 226 comprises silicon nitride and the capping layer 228 comprises silicon oxide. Each of the layers 222, 224, 226, and 228 may be formed by chemical oxidation, thermal oxidation, atomic layer deposition (ALD), CVD, lower pressure CVD, PECVD, and/or other suitable methods. In some embodiments, the dummy gates 208 are surrounded by gate spacers (not shown). The dummy gates 208 engage channel regions 212 of the underlying fins 204. In the present embodiment, the two dummy gates 208 share a source/drain (S/D) region 210. In alternative embodiments, the two dummy gates 208 do not share an S/D region 210. The trenches 230 have a width $W_{230}$ along the "Y" direction (FinFET channel length direction) and a height $H_{230}$ along the "Z" direction. In embodiments, an aspect ratio of the trenches 230 (as a ratio of $H_{230}$ over $W_{230}$) may be large.

Figures 4C, 4D:
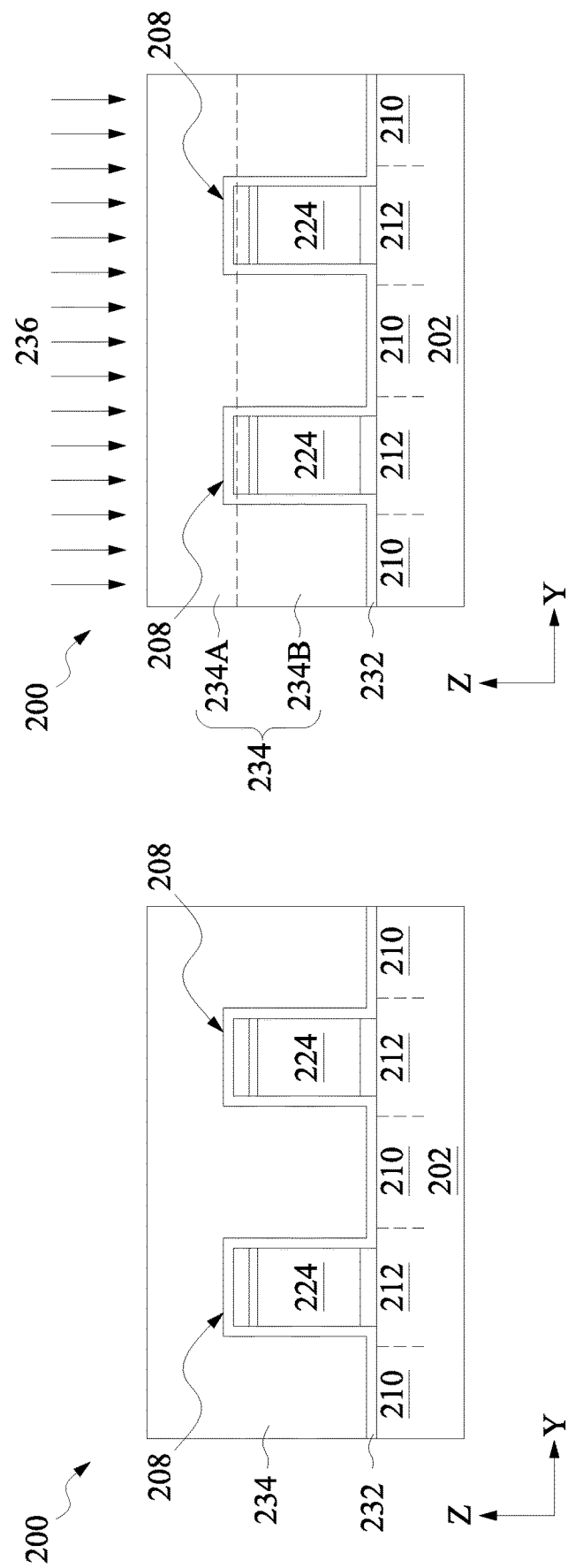

At operation 14A, the method 50 (FIG. 3) deposits a dielectric layer 234 over the dummy gates 208 and filling the trenches 230. Referring to FIG. 4C, in the present embodiment, an etch stop layer (ESL) 232 is formed over the fins 204 and the dummy gates 208 before the dielectric layer 234 is deposited. The ESL 232 may include SiN, SiCN, SiCON, or other suitable materials and may be formed by CVD, PVD, ALD, or other suitable methods. In the present embodiment, the dielectric layer 234 uses a low density dielectric material containing silicon and oxygen in order to properly fill the trenches 230. Further, the dielectric layer 234 is deposited using an FCVD method. The materials used for the dielectric layer 234 and the method of deposition thereof are similar to what is discussed with respect to the dielectric layer 114 in the operation 14 (FIG. 1). In some instances, the hardness of the dielectric layer 234 may not satisfy subsequent fabrication steps. In the present embodiment, the dielectric layer 234 is treated with an oxidizer to increase its hardness, as discussed below.

At operation 16, the method 50 (FIG. 3) treats the dielectric layer 234 with an oxidizer 236. Many respects of the oxidizer 236 are substantially the same as those of the oxidizer 116. Accordingly, some details of the oxidizer 236 are omitted here for the purpose of simplicity. In embodiments, the oxidizer 236 is an aqueous oxidizer such as DIW and DHF. The operation 16 is performed in a thermally controlled manner. Particularly, it is performed at a temperature below 100° C., such as in a range from 15° C. to 90° C. As a result, an upper portion 234A (or treated portion 234A) of the dielectric layer 234 is oxidized to have a higher hardness than a lower portion 234B (or untreated portion 234B) of the dielectric layer 234 which is not oxidized or insignificantly oxidized (FIG. 4D). In some embodiments, the hardness of the treated portion 234A is about 1.1~1.2 times higher than the hardness of the untreated portion 234B. Additionally, the upper portion 234A may have a higher film density than the lower portion 234B. In the present embodiment, the upper portion 234A extends below a top surface of the dummy gates 208.

At operation 18, the method 50 (FIG. 3) deposits another dielectric layer 238 over the treated portion 234A. The dielectric layer 238 has hardness higher than that of the dielectric layer 234 before it is treated. For example, the hardness of the dielectric layer 238 may be 1.1 to 1.5 times higher than that of the dielectric layer 234 before it is treated. The material(s) used for the dielectric layer 238 and the methods of deposition thereof are similar to what is discussed with respect to the dielectric layer 118 (FIG. 2E). Due to the treatment, adhesion between the dielectric layers 234 and 238 is improved.

Figure 4F:
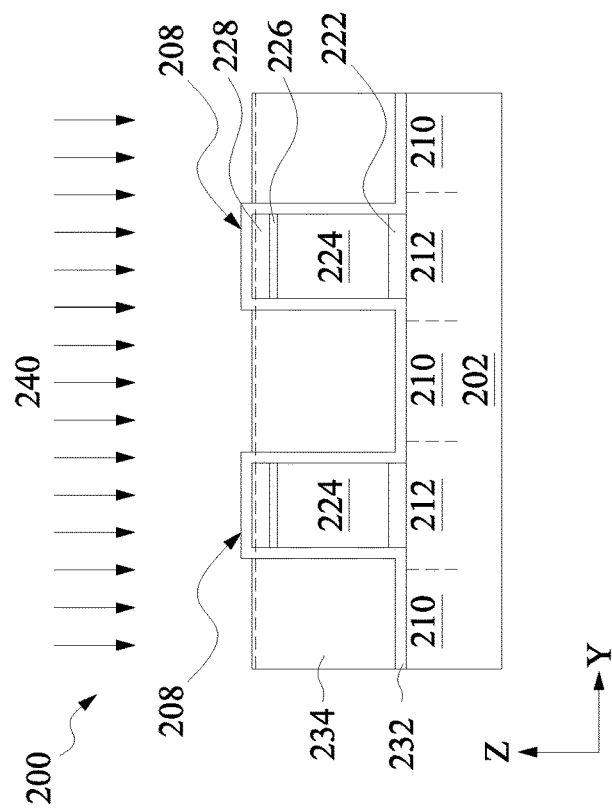
Figure 4E:
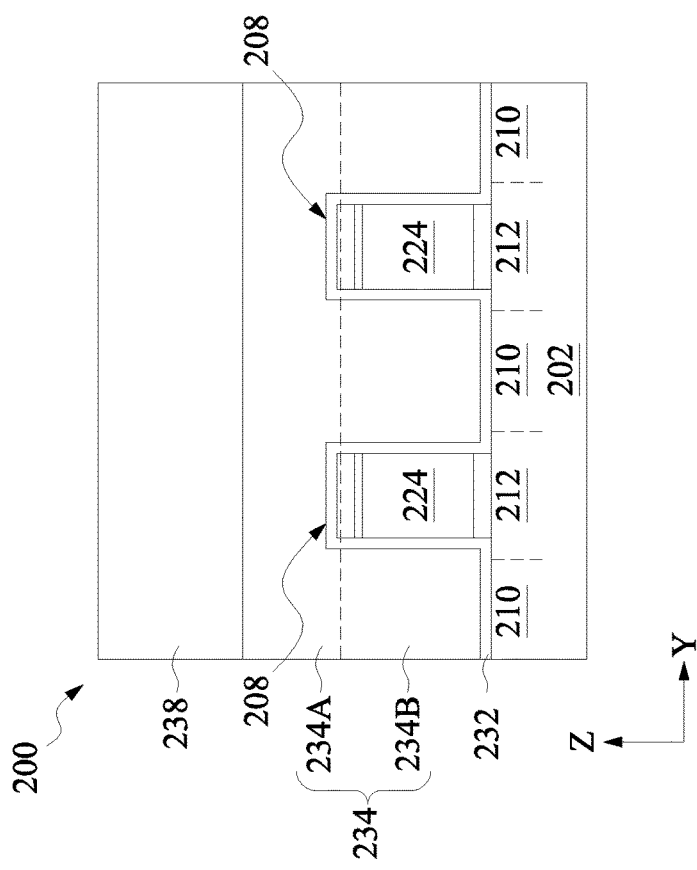

At operation 20, the method 50 (FIG. 3) performs a CMP process 240 to recess the dielectric layers 238 and 234 (FIG. 4F). Many respects of the CMP process 240 may be substantially the same as those of the CMP process 120 (FIG. 2F). Due to the treatment in the operation 16, the dielectric layer 234 (particularly the treated portion 234A) helps reduce scratch defects during the CMP process 240.

Figure 4G:
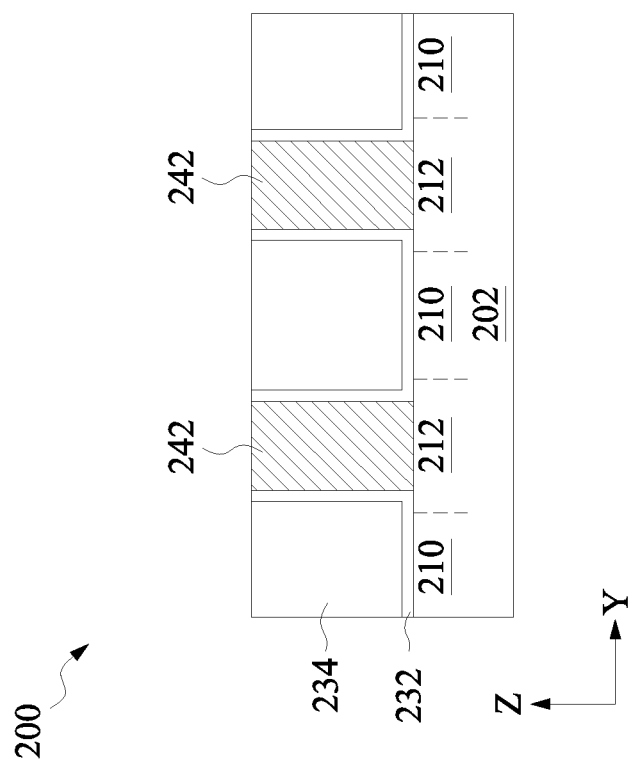

At operation 22A, the method 50 (FIG. 3) performs further steps to complete a final FinFET device. In the present embodiment, the operation 22A performs various etching, deposition, and planarization processes to replace the dummy gates 208 with a final gate 242 (FIG. 4G). For example, the operation 22A may remove the layers 228, 226, 224, and 222 by one or more etching processes, thereby forming openings. Subsequently, the operation 22 deposits the final gate 242 in the opening and performs a CMP process to planarize a top surface of the device 200. The final gate 242 may include an interfacial layer, a gate dielectric layer such as a high-k gate dielectric layer, a work function metal layer, and a metal fill layer. The various layers of the final gate 242 may be formed by chemical oxidation, thermal oxidation, ALD, CVD, plating, and/or other suitable methods.

Although not intended to be limiting, one or more embodiments of the present disclosure provide many benefits to a semiconductor device and a formation process thereof. For example, embodiments of the present disclosure provide methods for strengthening a dielectric layer, thereby reducing scratch defects in subsequent CMP processes. The strengthened dielectric layer also provides better adhesion with another dielectric layer deposited thereon. Methods according to embodiments of the present disclosure are cost-effective because they may be performed at a relatively low temperature (e.g., under 100° C.) with readily available oxidizing solutions. Yet, they may achieve a significant reduction in CMP scratch defects. In addition, methods according to embodiments of the present disclosure can be readily integrated with existing manufacturing flow.

In one exemplary aspect, the present disclosure is directed to a method of forming a semiconductor device. The method includes providing a precursor having a substrate and protrusions over the substrate. The protrusions are interposed by trenches. The method further includes depositing a first dielectric layer over the protrusions and filling the trenches, the first dielectric layer having a first hardness. The method further includes treating the first dielectric layer with an oxidizer and performing a chemical mechanical planarization (CMP) process to the first dielectric layer.

In another exemplary aspect, the present disclosure is directed to a method of forming a semiconductor device. The method includes providing a precursor having a substrate and fins over the substrate, the fins being interposed by trenches. The method further includes depositing a first silicon oxide layer over the fins and filling the trenches, the first silicon oxide layer having a first hardness. The method further includes treating the first silicon oxide layer with an aqueous oxidizer, resulting in a treated portion of the first silicon oxide layer above an untreated portion of the first silicon oxide layer. The treated portion of the first silicon oxide layer has a second hardness greater than the first hardness. The method further includes depositing a second silicon oxide layer over the treated portion of the first silicon oxide layer, wherein the second silicon oxide layer has a third hardness higher than the first hardness. The method further includes performing a chemical mechanical planarization (CMP) process to the second and first silicon oxide layers.

In yet another exemplary aspect, the present disclosure is directed to a method of forming a semiconductor device. The method includes providing a precursor having a substrate and protrusions over the substrate. The protrusions are interposed by trenches. The method further includes depositing a first silicon oxide layer over the protrusions and filling the trenches. The first silicon oxide layer has a first hardness. The method further includes treating the first silicon oxide layer with an aqueous oxidizer at a temperature lower than 100 degrees Celsius (° C.), resulting in a treated portion of the first silicon oxide layer, wherein the treated portion has a second hardness greater than the first hardness. The method further includes depositing a second silicon oxide layer over the treated portion, wherein the second silicon oxide layer has a third hardness higher than the first hardness. The method further includes performing a chemical mechanical planarization (CMP) process to the second and first silicon oxide layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   providing a precursor having a substrate and protrusions over the substrate, the protrusions being interposed by trenches;
   depositing a first dielectric layer over the protrusions and filling the trenches, the first dielectric layer having a first hardness;
   treating the first dielectric layer with an oxidizer, resulting in a treated portion of the first dielectric layer;
   after the treating of the first dielectric layer, depositing a second dielectric layer over the treated portion of the first dielectric layer, wherein the second dielectric layer has a second hardness higher than the first hardness; and
   performing a chemical mechanical planarization (CMP) process to both the first dielectric layer and the second dielectric layer to completely remove the second dielectric layer and to partially remove the treated portion of the first dielectric layer,
   wherein the treating of the first dielectric layer is performed at a temperature ranging from 15° C. to 90° C. and the oxidizer is dilute hydrofluoric acid (DHF) and a concentration of hydrofluoric acid in the oxidizer ranges from 0.005% to 0.1%.

2. The method of claim 1, wherein the treated portion of the first dielectric layer extends below a top surface of the protrusions.

3. The method of claim 1, wherein the treating of the first dielectric layer is performed at room temperature.

4. The method of claim 1, wherein the oxidizer is aqueous.

5. The method of claim 1, after the treating the first dielectric layer with an oxidizer, further comprising treating the first dielectric layer with deionized water (DIW).

6. The method of claim 1, wherein an aspect ratio between a height and a width of the trenches is greater than 12.

7. The method of claim 1, wherein the first and second dielectric layers include silicon and oxygen.

8. The method of claim 1, wherein the protrusions include semiconductor fins.

9. The method of claim 1, wherein the protrusions include gate structures.

10. A method of forming a semiconductor device, the method comprising:
providing a precursor having a substrate and fins over the substrate, the fins being interposed by trenches;
depositing a first dielectric layer over the fins and filling the trenches, the first dielectric layer containing silicon and oxygen and having a first hardness;
treating the first dielectric layer with an aqueous oxidizer, resulting in a treated portion of the first dielectric layer above an untreated portion of the first dielectric layer, the treated portion of the first dielectric layer having a second hardness greater than the first hardness;
depositing a second dielectric layer over the treated portion of the first dielectric layer, wherein the second dielectric layer contains silicon and oxygen and has a third hardness higher than the first hardness; and
performing a chemical mechanical planarization (CMP) process to completely remove the second dielectric layer and partially remove the treated portion of the first dielectric layer, wherein the treating of the first dielectric layer is performed at a temperature ranging from 15 degrees Celsius (° C.) to 90° C.

11. The method of claim 10, wherein the aqueous oxidizer is deionized water (DIW).

12. The method of claim 10, wherein the aqueous oxidizer is dilute hydrofluoric acid (DHF).

13. The method of claim 10, wherein a concentration of hydrofluoric acid in the aqueous oxidizer ranges from 0.005% to 0.1%.

14. The method of claim 10, wherein the treating the first dielectric layer with an aqueous oxidizer includes a first treating process with DIW and a second treating process with DHF.

15. A method of forming a semiconductor device, the method comprising:
providing a precursor having a substrate and protrusions over the substrate, the protrusions being interposed by trenches;
depositing a first dielectric layer over the protrusions and filling the trenches, the first dielectric layer containing silicon and oxygen;
treating the first dielectric layer with an aqueous oxidizer at a temperature lower than 100 degrees Celsius (° C.), resulting in a treated portion of the first dielectric layer;
depositing a second dielectric layer over the treated portion, wherein the second dielectric layer contains silicon and oxygen; and
performing a chemical mechanical planarization (CMP) process to completely remove the second dielectric layer and partially remove the treated portion of the first dielectric layer.

16. The method of claim 15, wherein the aqueous oxidizer is one of:
deionized water (DIW) and dilute hydrofluoric acid (DHF).

17. The method of claim 15, wherein the first dielectric layer has a first hardness before the treating of the first dielectric layer, the treated portion has a second hardness greater than the first hardness, and the second dielectric layer has a third hardness higher than the first hardness.

18. The method of claim 15, wherein the treating the first dielectric layer with an aqueous oxidizer includes a first treating process with DIW and a second treating process with DHF.

19. The method of claim 18, wherein a concentration of hydrofluoric acid in the DHF ranges from 0.005% to 0.1%.

20. The method of claim 18, prior to the treating the first dielectric layer with an aqueous oxidizer, further comprising an annealing process at a temperature ranging between 300° C. to 1200° C.

* * * * *